United States Patent [19]
Mumford

[11] Patent Number: 4,949,182
[45] Date of Patent: Aug. 14, 1990

[54] CCD SENSOR

[75] Inventor: Ronald W. J. Mumford, Hitchin, United Kingdom

[73] Assignee: Rank Cintel Limited, United Kingdom

[21] Appl. No.: 156,998

[22] Filed: Feb. 18, 1988

[30] Foreign Application Priority Data

Mar. 10, 1987 [GB] United Kingdom ............... 8705614

[51] Int. Cl.[5] ........................................... H04W 5/335
[52] U.S. Cl. ........................... 358/213.26; 358/213.23
[58] Field of Search ..................... 358/213.26, 213.23, 358/213.27, 44, 75

[56] References Cited

U.S. PATENT DOCUMENTS

| | | | |
|---|---|---|---|
| 4,654,698 | 3/1987 | Langworthy | 358/43 |
| 4,746,972 | 5/1988 | Takanashi et al. | 358/43 |
| 4,751,567 | 6/1988 | Hashimoto | 358/44 |
| 4,774,566 | 9/1988 | Kawamura et al. | 358/75 |
| 4,837,630 | 6/1989 | Ueda | 358/213.26 |
| 4,839,734 | 6/1989 | Takemura | 358/213.22 |

FOREIGN PATENT DOCUMENTS 164682 12/1981 Japan .

Primary Examiner—James J. Groody
Assistant Examiner—Robert M. Bauer
Attorney, Agent, or Firm—Ostrolenk, Faber, Gerb & Soffen

[57] ABSTRACT

A CCD sensor for use in telecine equipment has at least one transport register into which at least some of the sensor photosites discharge. A plurality of detectors are coupled to the transport register. Successive charge packets from the register are passed selectively to respective ones of the plurality of detectors in turn.

1 Claim, 4 Drawing Sheets

CCD SENSOR

BACKGROUND OF THE INVENTION

The present invention relates to an improved CCD (charge-coupled device) sensor, in particular, to a CCD sensor suitable for use in high definition television.

The proposed standard for high definition television lays down the following criteria.

| Line standard | 1125 |
| --- | --- |
| Field rate | 60 Hz, interlaced |
| Aspect ratio | 16 × 9 (1.77:1) |
| Active number of lines | 1035 |
| Active samples per line | 1920 |

From these criteria, it is possible to derive a specification for a CCD line array sensor suitable for use in telecine equipment for producing high definition television pictures.

This specification is dependent, firstly, on the types of film which are to be converted into video signals using the CCD sensor. In general, there are three types, as follows:

(1) General release, wide screen print which is non-anamorphic with an aspect ratio of 1.85:1;

(2) theatrical release prints with an anamorphic image having an aspect ratio of 2.35:1; and (3) documentary-type prints having an aspect ratio of 1.37:1

Where, for example, a theatrical release print with an aspect ratio of 2.35:1 is to be displayed on a high definition display format, steps must be taken to enable the whole area of the image to be monitored so that action taking place at the edges of the film image can be displayed if required. FIG. 1 of the drawings shows the theatrical release anamorphic format 2 with the high definition display format 3 in such a way that the high definition display 3 covers the entire height of the anamorphic format 2. To maintain the ability to cover action occuring at the edges of the film image, the entire film image must be scanned and means provided to allow the area of the image to appear in the high definition format to be selected as required. This technique is known as electronic panning.

To maintain the full resolution of 1920 samples laid down in the proposed standard for high-definition television, the film must be scanned line-by-line using a linear sensor array having a number N of active pixels or photo-detectors given by $$N = \frac{\text{anamorphic aspect ratio}}{\text{display aspect ratio}} \times \text{display samples}$$

$$N = \frac{2.35 \times 9}{16} \times 1920 = 2538$$

Thus, the minimum number of photo detectors which could be incorporated into a CCD sensor suitable for use in producing high definition television signals from all three film formats in general use is 2538.

In non-anamorphic wide screen film prints there is a large unused area between neighbouring frames. This is due to the aspect ratio which, as stated above, is 1.85:1. Typically, the frame spacing is 19 mm with the vertical information occupying only about 11.2 mm. This format will, therefore, generate the fastest clock rate requirement of a sensor capable of use with all three film formats.

For a film speed of 24 frames per second, the time T available for the active portion of each frame to be scanned by the sensor is given by $$T = \frac{\text{active frame height}}{\text{total frame height}} \times \frac{1}{\text{no. of frames per second}}$$

$$T = \frac{11.2}{19} \times \frac{1}{24} = 24.56 \text{ milliseconds}$$

Since the proposed standard for high definition television signals requires 1035 active lines, the time t available for scanning each line is $$t = \frac{24.56}{1035} = 23.73 \text{ ms}$$

However, the sensor also needs time to allow for video blanking, clamping circuits and photosite transfer time. It is reasonable to allow a total of 3 ms for these requirements, so the maximum time availabe for scanning each line is 20.73 ms. Consequently, a CCD sensor capable of producing high definition television signals from all three film formats in general use must be able to transport at least 2538 charges packets in no more than 20.53 ms. Thus, a clock speed of around 122 MHz is needed.

Current CCD sensor technology of the type used in telecine equipment is illustrated schematicaly in FIG. 2. The sensor 10 includes a plurality of photosites 12 which discharge into two transport registers 14 and 16. Alternate ones of the photosites 12 discharge into each of the two transport registers 14 and 16. The registers operate at around 15 MHz due to limitations imposed by the output detection and amplifier stages.

Clearly, such a sensor cannot meet the requirements of the high definition sensor proposed above. One proposal for overcoming this problem is shown in FIG. 3. In this device each of the two transport registers is divided into two separate registers 14a and 14b and 16a and 16b. The registers of each pair are clocked in parallel but in opposite directions, thus halving the time needed to extract the data from the transport registers. To obtain the required 122 MHz clock rate, each of the four registers 14a, 14b, 16a and 16b would need to be clocked at 30.5 MHz. This clock rate is still high and the device has the additional disadvantage that half the video signal from the transport registers is reverse and requires further manipulation to provide a final output signal.

SUMMARY OF THE INVENTION

The invention provides a CCD sensor comprising a plurality of photosites and at least one transport register into which at least some of said sensor photosites discharge in use. A plurality of detectors are coupled to said transport register so that successive charge packets from the said register are passed selectively to respective ones of said plurality of detectors in turn.

BRIEF DESCRIPTION OF THE DRAWINGS

A CCD sensor in accordance with the invention will now be described in detail, by way of example only, with reference to the drawings, in which.

DETAILED DESCRIPTION OF A PREFERRED EMBODIMENT

Figure 1:
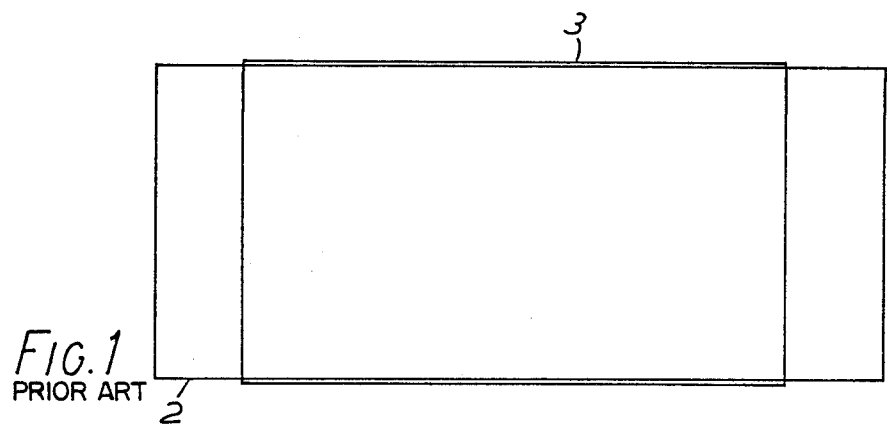
FIG. 1 illustrates the known theatrical releases anamorphic format.
Figure 2:
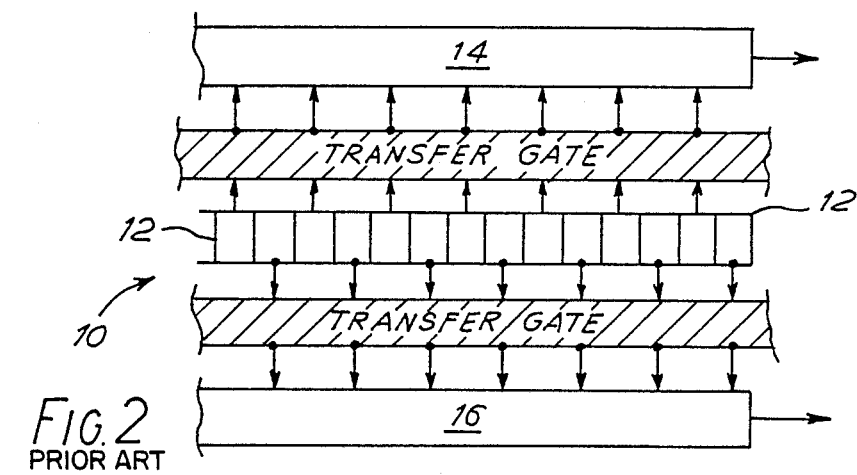
FIG. 2 is a schematic diagram of a known CCD sensor of the type used in telecine equipment.
Figure 3:
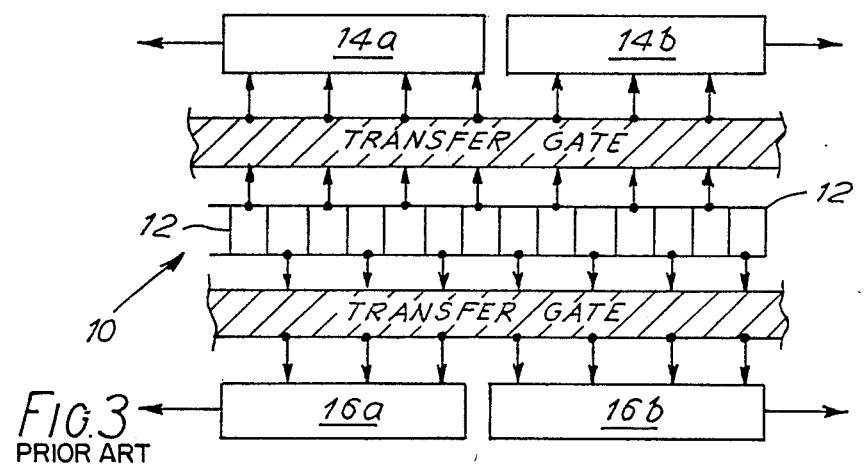
FIG. 3 shows a further prior art CCD sensor device.

The CCD sensor of the invention is broadly similar to that of FIG. 2, that is to say, there are two transport registers into which alternate ones of the linear array of photosites discharge through the transfer gate. The speed limitation within the transport registers themselves is limited theoretically only by electron mobility within the silicon material used. In devices using current buried channel technology, very high transport frequencies are possible. Indeed, frequencies of up to 1 gigahertz have been claimed for some devices.

We have appreciated that the real limitations on the speed of operation arise in the detection of the charge packets at the output of the transport registers. With a view to overcoming these limitations, we propose to provide a sensor in which the charge packets from the transport registers are sent to one of a plurality of detectors.

Figure 4:
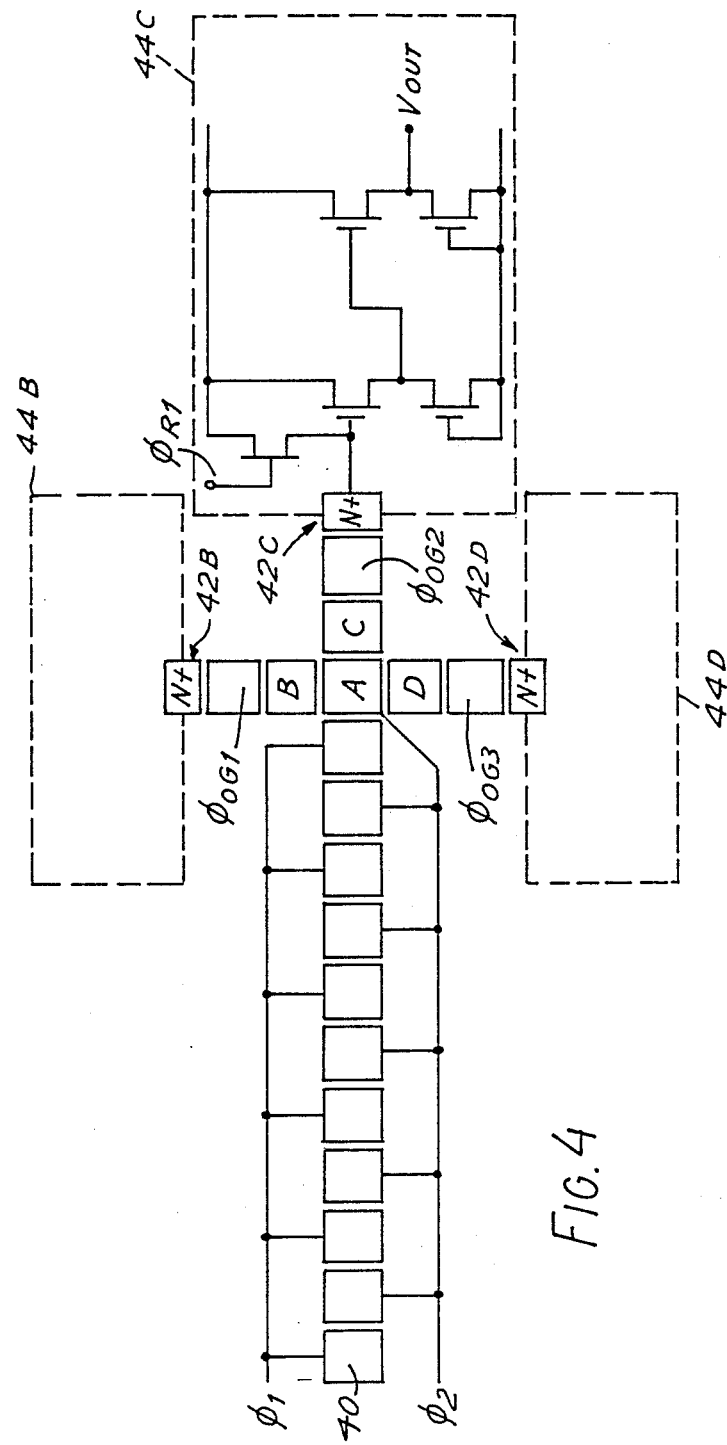
FIG. 4 is a fragmentary schematic view of a CCD sensor in accordance with the invention.

FIG. 4 shows one of the transport registers 40 of a CCD sensor of the general type shown in FIG. 2, that is a sensor in which alternate ones of the photosites discharge into one of two transport registers. The charge packets are directed sequentially into one of three detectors 42, distinguished by the labels B, C and D. Each of the detectors is provided with output circuitry 44.

As shown in FIG. 4, each transport register 40 has associated with it three extra transport wells B, C and D. The charge packets are directed sequentially into the three wells B, C and D and are then gated into the output detector diodes n+. The sensor, which has two transport registers, has therefore six detectors in total. Consequently, in order to achieve the desired clock rate of 122 MHz, each detector must operate at 122/6 MHz, that is approximately 20 MHz. There are already in existence sensors which can detect at up to 32 MHz, so a 20 MHz clock rate is within their capability.

Figure 5:
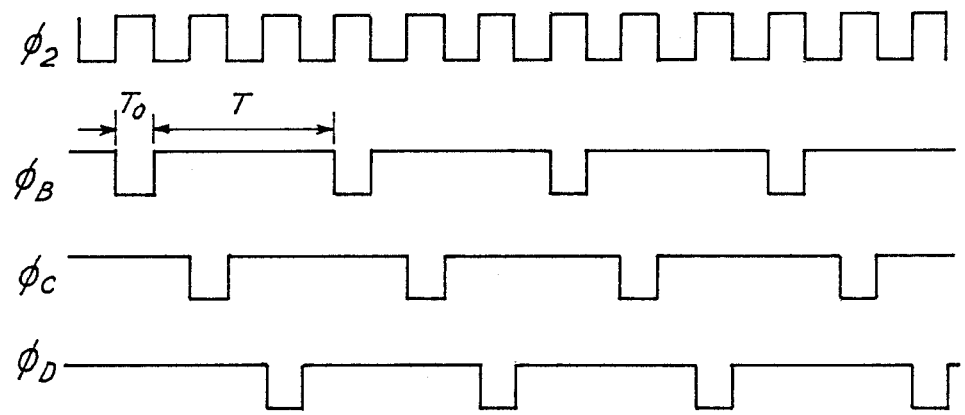
FIG. 5 illustrates the timing of clock signals supplied to the output stages of the sensor of FIG. 4.

The operation of the device of FIG. 4 is as follows. Clock signals $\phi_1$ and $\phi_2$ are switched in a complementary way to transport packets of charge along the transport register 40 towards its output end A. When a charge packet reaches A and 100 $_2$ is in its low state, the charge packet can be transferred to any one of detectors n+ (42B, 42C or 42D) by means of potential wells B, C and D similar to those in other parts of the transport register 40. Control clocks $\phi_{OG1}$, $\phi_{OG2}$ and $\phi_{OG3}$ are provided to control switching of the charge packets between the three detectors 42B, 42C and 42D by applying respective clock signals $\phi_B$, $\phi_C$ and $\phi_D$. These are arranged in sequence as shown in FIG. 5 so that when the clock signal $\phi_2$ is low, clock signals $\phi_B$, $\phi_C$ and $\phi_D$ are high. When $\phi_2$ is high, A is high, $\phi_B$ is low whilst $\phi_C$ and $\phi_D$ remain high. The cycle repeats twice more with $\phi_C$ and $\phi_D$ becoming low in turn.

As can be seen from FIG. 5, the time T between the clock signals $\phi_B$, $\phi_C$ and $\phi_D$ provides a considerably expanded transfer time during which the charge packets can be detected at the output diodes N+ of each of the detectors 42B, 42C and 42D. The charge at B is gated via $\phi_{OG1}$ to the output diode N+ which, in turn, is reset by a signal $\phi_{R1}$ provided by the output circuit 44B. The output gate will pass the signal during the time interval T but will be open or off during the period $T_0$. The output device N+ is reset during the period $T_0$. Operation of the detectors 42C and 42D and their associated output circuits 42C and 44D is similar.

It will be apparent that the phases of the video output signals from the three output circuits 44 receiving charge packets from each transport register cannot be added together without being resampled, or the frequency response will be reduced. Also, as the speed of 'on chip' amplifiers is slow due to design limitations arising from power dissipation requirements, it is necessary to re-sample with a fast external amplifier.

Figure 6:
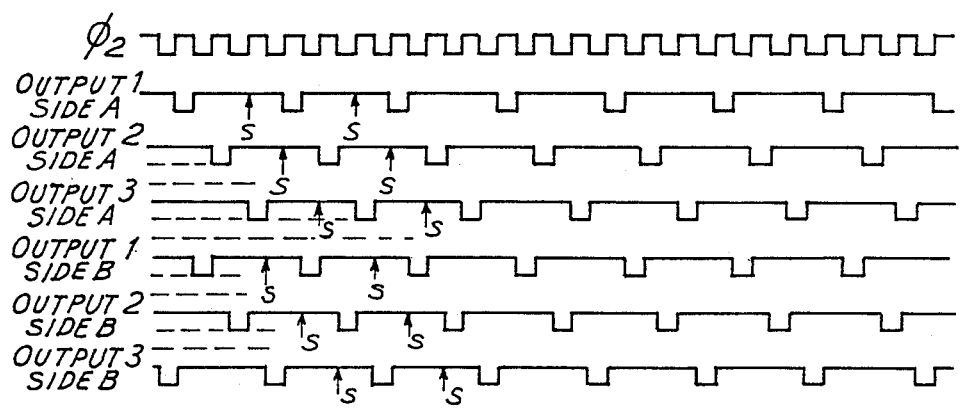
FIG. 6 illustrates schematically the outputs from the output states and possible sampling positions.

FIG. 6 shows the output of the six detectors 42 and possible sampling positions S. The width of the sampling pulse must not exceed half the duration of the clock signal $\phi_2$ cycle.

Figure 7:
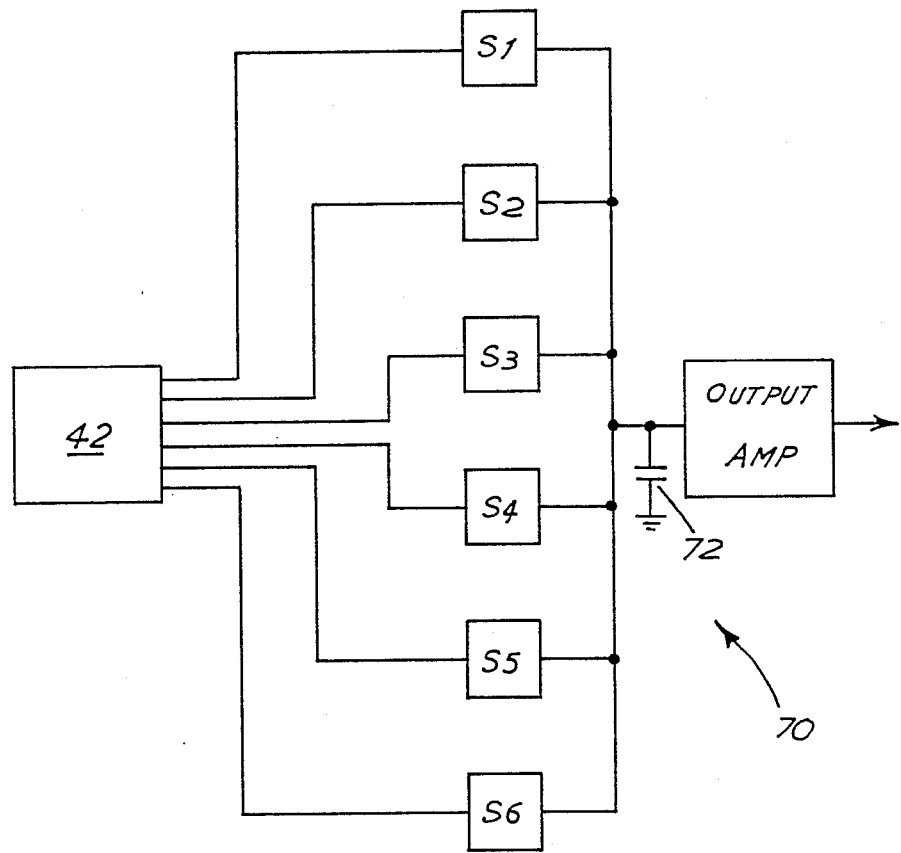
FIG. 7 is a block diagram of a combined output circuit for the sensor of FIG. 4.

FIG. 7 is a block diagram of an output circuit 70 suitable for combining the outputs from the six detectors 42 of the CCD sensor. The six output signals are each applied to a respective one of six sampling circuits $S_1$-$S_6$. The sampling circuits $S_1$-$S_6$ are turned on sequentially, as shown in FIG. 6. The outputs are integrated by a hold capacitor 72 before being buffered by the final output stage.

Thus, the invention may provide a CCD sensor suitable for use in providing video signals for high definition television from a variety of film formats commonly in use.

What is claimed:

1. A CCD sensor comprising:
   a plurality of photosites;
   at least one transport register into which at least some of said sensor photosites discharge in use;
   n detectors, n being an integer greater than 1, coupled to an output of said transport register so that successive charge packets serially discharged from said register are passed sequentially to respective ones of said plurality of detectors such that each detector receives one out of n said charge packets; and
   means for combining output signals of said n detectors to provide a resultant serial output signal in the order in which said charge packets are delivered to said detectors.

* * * * *